United States Patent [19]

Cuddihy et al.

[11] Patent Number: 5,019,533
[45] Date of Patent: May 28, 1991

[54] THERMAL TREATMENT OF SILICON INTEGRATED CIRCUIT CHIPS TO PREVENT AND HEAL VOIDS IN ALUMINUM METALLIZATION

[75] Inventors: Edward F. Cuddihy, Tujunga; Russell A. Lawton, La Crescenta; Thomas R. Gavin, Canyon Country, all of Calif.

[73] Assignee: The United States of America as represented by the adminstrator of the National Aeronautics and Space Administration, Washington, D.C.

[21] Appl. No.: 357,758

[22] Filed: May 26, 1989

[51] Int. Cl.$^5$ .................................. H01L 21/324
[52] U.S. Cl. .................................. 437/199; 437/187; 437/197; 437/247; 437/248; 357/82
[58] Field of Search ............... 437/199, 248, 247, 197, 437/187, 210; 357/82

[56] References Cited

U.S. PATENT DOCUMENTS 3,987,216 10/1976 Bhatia et al. ................. 437/199
4,525,221 6/1985 Wu ................................. 437/199

FOREIGN PATENT DOCUMENTS 0161026 11/1985 European Pat. Off. ........... 437/248

Primary Examiner—Brian E. Hearn
Assistant Examiner—Tuan Nguyen
Attorney, Agent, or Firm—Thomas H. Jones; Harold W. Adams; John R. Manning

[57] ABSTRACT

Voids in aluminum metallization conductors on a chip are avoided or healed after the chip is subjected to thermal treatment at a high temperature sufficient to allow diffusion of silicon by rapidly cooling the chip, preferably by immersion of the chip in liquid nitrogen.

5 Claims, 1 Drawing Sheet

THERMAL TREATMENT OF SILICON INTEGRATED CIRCUIT CHIPS TO PREVENT AND HEAL VOIDS IN ALUMINUM METALLIZATION

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

This invention relates to the manufacturing process of silicon integrated circuits and more particularly to process steps which require heating an integrated circuit chip to a high temperature after metallization of conductors with aluminum, such as the step of attaching the chip to a ceramic package or attaching a lid over the package, and thereafter quenching the heated chip assembly in order to prevent voids, or to heal such voids once they have developed in aluminum metallization.

BACKGROUND ART

One of the most critical reliabilitY problems afflicting silicon integrated circuits (IC) area voids which develop in the narrow (<10 μm) aluminum metallization deposited on the surface to provide interconnecting conductors. These voids occur at the edge of a conductor, and can extend across the entire width of the conductor causing an open circuit failure condition. When the void occurs only part way across, there was concern that it could lead to a time-dependent failure when the chip is electrically functional. Another concern was thought to be that residual stresses in the aluminum metallization conductor could cause further time-dependent propagation of the voids even when not electrically operational.

Silicon ICs fabricated for spacecraft applications were found to have voids in the aluminum metallization during a routine destructive physical inspection. The ICs had already been burned in and flight qualified, and had completed a final reliability evaluation by means of a life test for 1300 house at 125° C. Following the life test, the parts were found to be electrically functional with no problems of any kind indicated until "delidding" for visual inspection. Voids were found during that visual inspection using a scanning electron microscope (SEM). When equivalent IC chips yet to be lidded were inspected, no voids were found. Consequently, the source of the voids was believed to be caused by the process of heat-sealing the lids onto the ceramic packages rather than any of the follow-on testing processes.

A review of the literature revealed that such voids in aluminum metallization of IC chips is observed throughout the microelectronics industry and were believed to occur during the IC wafer process, die-attach process, and also during the lidding process. These voids being observed were different from those created by electromigration effects at high current densities ($\geqq 500,000$ amps/cm$^2$) in that these ICs were unbiased up until the time the voids were observed, and were sometimes observed in places where current would never flow even if biased. Such voids induced without electrical current have been referred to in the literature as "stress-induced voids."

The aluminum metallization conductors on the ICs fabricated for spacecraft applications were 1 micron thick and 7 microns wide and the voids observed on the edges of the lines and extended inwards approximately 0.6 to 2.0 microns. These lines carry a peak amperage of about 100μ amps, and based on the 500,000 amp/cm$^2$ criteria, would not be a reliability concern in respect to electromigration. However, the concern that evolved was related to the possibility of further void propagation during a long-term mission lifetime (80,000 hours at 35° C.), which could conceivably narrow the aluminum metallization lines to increase current at the void above 500,000 amp/cm$^2$, and thus cause electromigration effects leading to open circuit failures (cracks).

No literature has been found which specifically address the issue of slow. long-term (i.e., 80,000 hours) void propagation at nominally constant ambient temperature. It was noted, however, that virtually all theoretical efforts at modeling these voids tended to consider stresses in the aluminum metallization conductors resulting from thermal expansion mismatches with the silicon substrates and the glass passivation over the metallization. These stresses were related in turn to creep of the aluminum metallization lines, vacancy migrations within the aluminum and resultant formation of void clusters and other metallurgical characteristics.

In apparent support of stress considerations based on thermal expansion mismatch effects, these same ICs had experienced voids in earlier efforts to use a high temperature (~460° C.) gold eutectic as the die-attach. When the die-attach process was switched to an epoxy which cures under 200° C., void problems ceased to occur. Further, two vendors had been involved in packaging these ICs, and there were differences between them in the peak die temperatures reached during the lid sealing process. The peak temperatures for vendor "A" was equal to or less than 240° C., whereas for vendor "B", the peak die temperatures reached a range between 280° C. to 330° C. Vendor "B" was lidding the ICs for spacecraft applications when the voids were discovered by the routine destructive physical analysis referred to above. No voids were found in ICs lidded by vendor "A" at the lower die temperatures under 240° C.

It was postulated that the voids were due in part to thermal-expansion mismatches associated with the higher levels of stresses (strains) which would be developed in the aluminum metallization conductors, resulting from the greater temperature differences between ambient and either the die temperatures of vendor "B", or the gold eutectic bonding temperatures. An experiment was undertaken to expose the ICs with voids to a series of lower temperatures below ambient to see if a further increase in the voids would occur from added stresses and strains associated with the greater temperature differences. The intent was to monitor the propagation of the voids as a function of time and temperature to develop a mathematical relationship which could be used for life time extrapolations at ambient operating temperatures.

In preparation for this experiment, a preliminary extreme temperature test (direct immersion into liquid nitrogen from ambient) was carried out to achieve an appreciation of the magnitude of further void growth. Unexplainably, there was no detectable void growth. In fact, nothing had happened at all. This unexpected result prompted a second extreme temperature test which involved heating the parts first to 200° C. for 30 minutes followed by direct immersion into liquid nitrogen (−196° C.). It was surprisingly observed that the voids did not experience any growth, and instead had been healed by this extreme thermal treatment. The voids were gone, and the aluminum metallization conductors were fully restored.

These preliminary tests were all carried out with the glass passivation over the surface of the ICs remaining intact. The ability to observe the voids through the glass passivation was made possible by an enhanced SEM backscattering technique. SEM photographs of a typical void pattern viewed through the glass passivation by enhanced backscattering and by normal SEM with the glass passivation removed were virtually identical. This demonstrated that removal of the glass passivation did not produce voids.

A controlled experiment was carried out in which unlidded parts without voids were exposed for 30 minutes to temperatures of 200°, 250°, 300°, 350°, and 400° C. Following the exposure time, half of the parts from each temperature were rapidly cooled by direct immersion into liquid nitrogen, while the other half were slowly cooled to ambient over a 2–4 hours time period. Observations of voids in the ICs are detailed in the following table;

TABLE I

Effect of High Temperature Exposure and Cooling (Annealing) Rate on Void Formation

| Peak Exposure Temperature* °C. | Cooling (Annealing) Rate Conditions | | |
|---|---|---|---|
| | Direct Immersion into Liquid Nitrogen Voids | 2–4 Hours Slow Cooling to Ambient** Voids | Void Density |
| 200 | None | None | 0 |
| 250 | None | 2 | 3 |
| 300 | None | 15 | 25 |
| 350 | None | 40 | 69 |
| 400 | None | 80 | 138 |

*Parts heated at indicated temperature for 30 minutes.
**Number of voids counted over a line length of 0.580mm (22.8 mils). The void density if reported as voids/mm.

For all parts rapidly cooled from a high temperature between 200° and 400° C. by direct immersion into liquid nitrogen, no voids were formed. In contrast, the slow-cooled ICs developed voids, with the void density increasing with increasing temperature above 200°C.

The heating and cooling pattern on these ICs were then exchanged. All of the ICs without voids were reheated for 30 minutes at 300° C. followed by slow cooling to ambient over a 2–4 hours time period. They now all had voids. Conversely, all of the parts with voids were reheated at 200° C. for 30 minutes followed by direct immersion into liquid nitrogen. Interestingly, the voids did not heal. However, the test was repeated on these ICs having voids at progressively higher exposure temperatures. When heated finally at 350° C. or higher for 30 minutes followed by direct immersion into liquid nitrogen, the voids were all healed. Thus, the process of void formation and healing has been found to be reversible for the silicon ICs.

It is unclear why voids produced during the lid-sealing process at vendor "B" could be healed by liquid nitrogen quenching from temperature exposures as low as 200° C., in contrast to this controlled experiment. One explanation may be that the exposure time of heating during the lid-sealing process of vendor "B" is in the order of 1 minute, compared to 30 minutes used in the control experiment.

Coincidentally, vendor "A" had separately fabricated other devices using narrower aluminum metallization conductors (~3 to 4 microns wide) which were severely full of voids and rejected for that reason. With the discovery of a thermal treatment in the controlled experiment just described above, this same healing treatment was carried out for these other defective devices. However, using a 200° C. peak temperature, that treatment did not heal the voids. Again it was reasoned that perhaps a higher peak temperature was needed, such as a peak temperature of 400° C. which healed the voids when used, although some partial healing was observed to start at temperatures above 300° C. for these other defective devices.

The void densities in the $V_{DD}$ and $V_{SS}$ metallization conductors of the ICs used in the controlled experiment were measured on ICs from different production lots after burn-in as part of the initial void propagation investigation. The intent was to experimentally find production lots which may be generically free of voids. The results of 29 lots are given in the following Table II in units of voids/mm.

TABLE II

Void Densities Measured in ICs After Burn-In

| Lot No. | Void Density Voids/mm | |
|---|---|---|
| | $V_{DD}$ | $V_{SS}$ |
| 1 | 39.2 | 28.6 |
| 2 | 45.7 | 17.1 |
| 3 | 36.6 | 20.2 |
| 4 | 48.2 | 32.6 |
| 5 | 66.9 | 43.0 |
| 6 | 67.8 | 49.7 |
| 7 | 60.2 | 40.0 |
| 8 | 50.7 | 30.5 |
| 9 | 77.9 | 59.0 |
| 10 | 71.0 | 84.8 |
| 11 | 46.7 | 71.0 |
| 12 | 0 | 3.43 |
| 13 | 28.4 | 36.6 |
| 14 | 30.3 | 30.8 |
| 15 | 40.6 | 29.1 |
| 16 | 40.9 | 44.2 |
| 17 | 21.1 | 19.4 |
| 18 | 7.97 | 12.1 |
| 19 | 15.5 | 38.5 |
| 20 | 45.6 | 64.5 |
| 21 | 0 | 8.13 |
| 22 | 47.8 | 48.4 |
| 23 | 48.3 | 50.6 |
| 24 | 57.3 | 58.1 |
| 25 | 18.4 | 24.0 |
| 26 | 0 | 0 |
| 27 | 11.4 | 14.5 |
| 28 | 0 | 0 |
| 29 | 13.8 | 20.9 |

Note that the values range from 0 to 84 but tend to cluster in the range of 40 to 60 voids/mm. These values in Table II can be compared with the values reported in Table I for the controlled experiment, which reveals a relationship between void density and the peak exposure temperature. The peak die temperature during the lid-sealing process at vendor "B" ranged between 280° to 330° C., which predicts from Table I void densities nominally in the range of 3 to near 69 voids/mm. These values are consistent with those given in Table II from actual production lots. It can be inferred that these voids are thermally driven with the void density related to lid-sealing temperatures in effect at the time each lot of parts was being processed.

This same activity which counted void densities in the production lots after burn-in also involved measurement of the length of the voids included in the count, a total of 1584 measurement. The void lengths ranged between 0.6 to 2.0 microns, and the data was statistically analyzed and found to follow a log-normal distribution. This made it possible to predict probabilities for the possibilities of large void lengths in parts still lidded. The predictions are given in the following Table III, which indicates the probability of having a void length greater than 2 microns was in the order of 0.3%.

TABLE III

Void-Length Distribution in IC's

| L, Length (Microns) | Probability of Void-Length > L | |
|---|---|---|
| | After Burn-In* | After Life-Test** |
| 2 | .003098 | .005760 |
| 3 | .000075 | .000060 |
| 4 | .000003 | .00000089 |
| 5 | .00000018 | Essentially Zero |
| 6 | Essentially Zero | Essentially Zero |

*Based on 1584 void length measurements.
**Based on 119 void length measurements.

The probability falls off rapidly with increasing void length and becomes virtually zero at 6 microns. Using this statistical analysis technique offered a possibility to investigate if voids can propagate from thermal aging. The parts which were delidded for the routine destructive parts analysis following the life-test at 125° C. for 1300 hours had a total of 119 voids, whose lengths were measured. Again, the void-lengths ranged between 0.6 to 2.0 microns, and followed a log-normal distribution. The probabilities versus void-length for the data measured after the life test are reported in Table III and can be compared with the burn-in data. There is virtually no difference, and certainly there are no indications of any substantial void growth from thermal aging for 1300 hours at 125° C. for these ICs.

STATEMENT OF THE INVENTION

In accordance with the present invention, a void in a conductor produced by metallization of aluminum on a silicon chip at a high temperature equal to or greater than 200° C. is prevented or healed by very rapid cooling of the chip, such as by quenching the chip in an inert liquid at a temperature well below ambient temperature (about 25° C.), such as liquid nitrogen ($-196°$ C.). If quenching is done immediately after metallization of the aluminum, voids are prevented. If voids have occurred for any reason, they may be healed by reheating the chip to a high temperature greater than 200° C., preferably about 350° C. for about 30 minutes, to restore aluminum in the void and then very rapidly cooling the chip as in the case of initial metallization of the aluminum conductor.

DETAILED DESCRIPTION OF THE INVENTION

Figure 1:
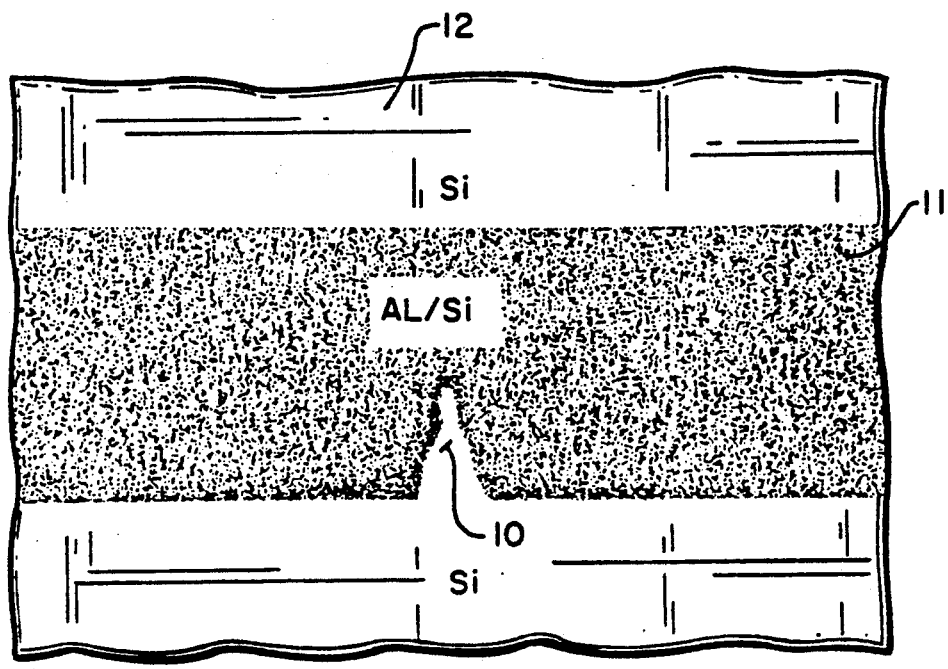
FIG. 1 illustrates a section of an aluminum conductor on a silicon chip with a void partially through the width of the conductor.

The discovery that this thermal treatment cycle healed voids, rather than further propagating them, suggested that mechanical stress effects arising exclusively from thermal expansion mismatch considerations was not the cause of this void problem, or at least not the sole cause since reheating and rapid cooling healed the voids. Moreover, further experiments carried out with reheating and slower cooling rates from the peak temperatures did not heal the voids. This also seems contrary to exclusively mechanical property behavior, and begins to suggest that other physical and/or chemical processes, which may be activated or accelerated at elevated temperatures and then influenced by cooling rates, are causing or healing the voids. In light of the healing discovery, a theoretical model based on the solution and diffusion behavior of silicon dissolved in the aluminum metallization is advanced in accordance with the present invention for both the healing and the formation of voids in a silicon IC chip having aluminum metallization conductors.

In essence, the "silicon model" states that a void, observed at room temperature after some thermal treatment in excess of 200° C., is the equivalent volume of silicon which has precipitated out of the aluminum metallization, which is an alloy of aluminum and silicon (1% by weight). Upon deposition of the alloy, it is believed that more silicon diffuses into the alloy from the silicon IC through windows in the $SiO_2$ film at sites where an ohmic connection is desired. But, as the aluminum metallization cools slowly in an atmosphere about 250° C., silicon precipitates out of the alloy leaving a void where the silicon has precipitated out of the metallization. On reheating, silicon redissolves into the aluminum restoring the volumetric shape of the metallization conductor, thus making it possible to heal voids if the cooling rate is caused to be at a rate sufficient to prevent voids.

Because of rapid diffusion effects at elevated temperatures, the aluminum/silicon alloy tends toward an internal equilibrium distribution when the chip is reheated, hence the healed void is not to be viewed as simply filling with 100% silicon. On cooling, the solubility of silicon decreases rapidly with decreasing temperature, which will cause precipitation. However, the pattern of silicon precipitation will depend on cooling rates, which in turn will dictate whether a void will or will not form or reform after heating. Experimental studies have shown that on cooling, silicon seeks to preferentially migrate to a pre-existing nucleation site, such as a silicon nodule, then precipitates out of the aluminum at this site. J. O. McCaldin, et al., "Precipitation of Si from the Al Metallization of Integrated Circuits," App. Phys. Lett., Vol. 20, No. 4, Feb. 15, 1972; H. Sankur, et al., "Solid-Phase Epitaxial Growth of Si Mesas from Al Metallization," App. Phys. Lett. Vol. 22, No. 2, Jan. 15, 1973.

Migration requires a slow cooling rate to permit sufficient time for the silicon to diffuse to a preferred nucleation site. On the other hand, rapid cooling, such as immersion in liquid nitrogen, stops migration and, because of such rapid cooling, forces the silicon to precipitate locally within the aluminum, in essence as fine filler particles within the aluminum acting as a binder matrix. Hence this fine dispersion of precipitated silicon retained within the aluminum matrix maintains the volumetric shape of the initial aluminum metallization conductor, or in other words no void is formed.

It is observed that the voids tend to form on the edges of the metallization lines and extend inward as shown in FIG. 1 by a void 10 in an aluminum metallization conductor 11 formed on a silicon chip 12. The silicon model offers a possible explanation for this effect. The solubility of silicon in aluminum increases with increasing pressure. H. Mii, et al., "Solid Solubility of Si in Al Under High Pressure," Japanese Journal of Applied Physics, Vol. 15, No. 5, May 1976. Thus, any mechanical action, such as results from thermal expansion mismatch which tends to increase the compressive (pressure) stress at specific locations in the aluminum metallization, will also tend to locally increase silicon solubility at that site.

Finite element modeling has revealed that the site of highest compressive stress occurs in the aluminum edge at the glass/aluminum interface. S. K. Groothuis, et al., "Stress Related Failures Causing Open Metallization," IEEE 25th Annual Proc. Rel. Phys., pp. 1-8, 1987. Thus, it can be expected that this will also be the site for highest silicon concentration. It can be speculated that the void will form in the regions having the higher concentrations of silicon. On slow cooling, both the temperature and pressure will decrease at the edges causing a larger lowering of silicon solubility there than at places where temperature alone is effective. The resulting enhanced reduction in silicon concentration favors local void formation at the edges of the aluminum metallization lines.

The silicon model of void formation requires that the silicon atoms can diffuse (migrate) during the time period of slow cooling to preferential nucleation sites that may be dimensionally separated on the order of line widths and thicknesses. The experimentally measured diffusivity of silicon in aluminum metallization lines has been reported in McCaldin, et al., App. Phys. Lett., Dec. 15, 1971, cited above, and using standard equations published in J. Crank, *The Mathematics of Diffusion*, Oxford University Press, London (1956), the one-dimensional diffusion length of silicon atoms in aluminum can be generated as a function of time and temperature. Calculated diffusion lengths in the following Table IV provide an appreciation that above 200° C., silicon can rapidly diffuse over distances associated with typical micron widths and thicknesses of aluminum metallization lines.

TABLE IV

Diffusion Length of A Silicon Atom in Aluminum as a Function of Time and Temperature

| Temperature (0°C.) | Diffusion Coefficient (D)* $cm^2/sec$ | Diffusion Length, $X = 10^4 \sqrt{Dt}$ , $\mu m$ | | | |
|---|---|---|---|---|---|
| | | t = 30 secs | t = 60 secs | t = 90 secs | t = 120 secs |
| 400 | $3.45 \times 10^{-9}$ | 3.22 | 4.55 | 5.6 | 6.43 |
| 380 | $2.28 \times 10^{-9}$ | 2.61 | 3.7 | 4.53 | 5.23 |
| 360 | $1.46 \times 10^{-9}$ | 2.09 | 2.96 | 3.63 | 4.19 |
| 340 | $9.13 \times 10^{-10}$ | 1.65 | 2.34 | 2.87 | 3.31 |
| 320 | $5.52 \times 10^{-10}$ | 1.29 | 1.82 | 2.23 | 2.57 |
| 300 | $3.22 \times 10^{-10}$ | 0.98 | 1.4 | 1.7 | 1.96 |
| 280 | $1.80 \times 10^{-10}$ | 0.74 | 1.04 | 1.27 | 1.47 |
| 260 | $9.69 \times 10^{-11}$ | 0.54 | 0.76 | 0.93 | 1.08 |
| 240 | $4.96 \times 10^{-11}$ | 0.39 | 0.55 | 0.67 | 0.77 |
| 220 | $2.40 \times 10^{-11}$ | 0.27 | 0.38 | 0.47 | 0.54 |
| 200 | $1.10 \times 10^{-11}$ | 0.18 | 0.26 | 0.31 | 0.36 |
| 180 | $4.66 \times 10^{-12}$ | 0.12 | 0.17 | 0.21 | 0.24 |
| 160 | $1.83 \times 10^{-12}$ | $7.41 \times 10^{-2}$ | 0.105 | 0.128 | 0.15 |
| 140 | $6.57 \times 10^{-13}$ | $4.44 \times 10^{-2}$ | $6.28 \times 10^{-2}$ | $7.70 \times 10^{-2}$ | $8.88 \times 10^{-2}$ |
| 120 | $2.13 \times 10^{-13}$ | $2.53 \times 10^{-2}$ | $3.57 \times 10^{-2}$ | $4.37 \times 10^{-2}$ | $5.05 \times 10^{-2}$ |
| 100 | $6.09 \times 10^{-14}$ | $1.35 \times 10^{-2}$ | $1.90 \times 10^{-2}$ | $2.34 \times 10^{-2}$ | $5.05 \times 10^{-2}$ |
| 80 | $1.52 \times 10^{-14}$ | $6.74 \times 10^{-3}$ | $9.54 \times 10^{-3}$ | $1.17 \times 10^{-2}$ | $1.35 \times 10^{-2}$ |
| 60 | $3.19 \times 10^{-15}$ | $3.09 \times 10^{-3}$ | $4.37 \times 10^{-3}$ | $5.36 \times 10^{-3}$ | $2.57 \times 10^{-3}$ |
| 40 | $5.50 \times 10^{-16}$ | $1.28 \times 10^{-3}$ | $1.82 \times 10^{-3}$ | $2.22 \times 10^{-3}$ | $2.57 \times 10^{-3}$ |
| 20 | $7.46 \times 10^{-17}$ | $4.73 \times 10^{-4}$ | $6.69 \times 10^{-4}$ | $8.19 \times 10^{-4}$ | $9.46 \times 10^{-4}$ |
| 0 | $7.55 \times 10^{-18}$ | $1.50 \times 10^{-4}$ | $2.13 \times 10^{-4}$ | $2.60 \times 10^{-4}$ | $3.00 \times 10^{-4}$ |

Figure 2:
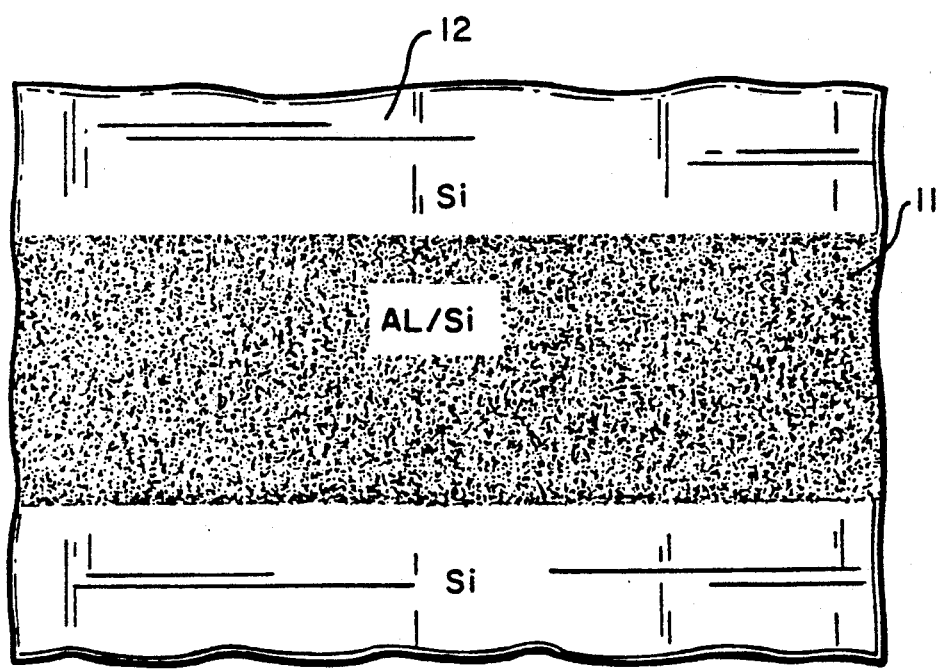
FIG. 2 illustrates the aluminum metallization conductor of FIG. 1 after it has been healed by the method of this invention.

In fact, the information provided will support the silicon model theory that rapid cooling, such as immersion in liquid nitrogen, is able to virtually stop silicon migration and therefore avert void formation as shown in FIG. 2 which shows the same IC chip as in FIG. 1, but rapidly cooled instead of slowly cooled after heating to a temperature above 200° C. Lastly, the information above given in Table IV shows that at elevated temperatures 200° C., i.e., at temperatures where the diffusion coefficient D is greater than $1.10 \times 10^{-11}$ $cm^2/sec$, the diffusion of silicon between regions of differing silicon solubility (local differences in compressive stresses) is not a diffusion rate limiting step. The diffusion of silicon required by the silicon model theory of voids and healing of voids will occur.

Although thermal treatment and immersion in liquid nitrogen to avert voids in the aluminum alloy (1 wt. % Si) metallization of integrated circuit chips was discovered in an effort to study the possibility of further propagation of pre-existing partial voids, the discovery was extended to healing voids. The discovery is inconsistent with state-of-the-art theories which assign the void formation exclusively to stresses and strains associated with thermal expansion mismatches between the aluminum metallization and the glass passivation and silicon substrate of IC chips.

The thermal healing treatment consists of heating the IC chip with voids to temperatures in excess of 200° C., followed by very rapid cooling, as by immersion in liquid nitrogen. A new theory, based on the solubility and migration (diffusion) of silicon in aluminum, is advanced which can satisfactorily explain the reversible formation and healing of voids. It therefore follows that the technique of very rapid cooling may also be used to avert the formation of voids in aluminum metallization on IC chips at any time high temperature heating is required for further processing of the IC chips, such as in the process of die-attachment to a ceramic package or lidding the package. This thermal healing treatment of a partial void may be considered as having been illustrated by FIGS. 1 and 2, where FIG. 2 represents the aluminum metallization 11 as having been thermally treated to heal the void followed by rapid cooling.

As noted in Table IV, the invention is operative if reheating is done to a temperature in excess of 200° C. and preferably above about 300° C. At temperatures much lower than about 300° C. (approaching 200° C.), the solubility of Si in Al is quite low, and due to differences in thermal expansion between the Si substrate and Al film, there is a substantial volume difference which occurs during the cooling process. Such volume differences may produce defects due to stress. However, a rapid quench after heating to a peak temperature in excess of 200° C. may prevent any such stress defects and more importantly will prevent voids due to silicon precipitation in accordance with this invention. The evidence of this silicon model based upon precipitation and diffusion is that voids will be healed by heating and rapid cooling; what is required is heating or reheating to temperatures sufficiently in excess of 200° C. to allow diffusion of silicon into voids of aluminum metallization lines having micron widths and thicknesses and rapidly cooling at a rate sufficient to prevent precipitation of silicon from the aluminum metallization. Thus, the silicon precipitation considerations of void formation are more important to the present invention than the thermal expansion mismatch considerations.

According to the data in Table IV, the precipitation of silicon out of the aluminum metallization is not very fast. For example, at 200° C. the diffusion length is only 0.18 μm in 30 seconds, and after an interval four times as long (120 seconds), the diffusion length is only doubled to 0.36 μm. Therefore, a much less drastic quench than plunging into liquid nitrogen would be sufficient. It would be sufficient to spray the metallization of a typical IC chip with freon or some other cooling gas that is inert and below 0° C. at the moment of contact with the metallized surface of the chip depending upon the dimensions (width and thickness of the metallized chip) and the volume of the silicon chip itself. Thus, what is required is simply rapidly cooling at a rate that will prevent diffusion of silicon over lengths that will produce voids, which can be empirically determined for specific IC chips. However, since rate of cooling will depend upon the temperature of the quenching bath or spray, it is desirable to use a bath of liquid nitrogen for the highest possible cooling rate that may be provided conveniently. Other baths may be used if maintained at 0° C. or below, such as by immersing a container of inert quenching liquid in an ice water bath.

Although specific examples and preferred embodiments of the invention have been described, it is recognized that variations in temperatures, and therefore cooling rates, may be made and still be able to achieve the desired results of preventing voids after heat treatment of an IC chip and healing voids after reheating IC chips. Consequently, it is intended that the claims be interpreted to cover such variations.

We claim:

1. A method of preventing voids, or healing such voids once they have developed, in aluminum metallization conductor lines of micron widths and thicknesses on a silicon integrated circuit chip upon subjecting said chip to thermal treatment upon depositing said aluminum metallization conductor lines, and at any time thereafter, comprising the steps of subjecting said chip to thermal treatment for a period sufficient to allow diffusion of silicon into voids of aluminum metallization conductor lines and then rapidly cooling said chip at a rate sufficient to prevent precipitation of silicon from said aluminum metallization conductor lines by quickly immersing said chip in a volume of liquid nitrogen at a temperature sufficiently below 25° C. to provide said sufficient cooling rate, wherein said inert liquid is nitrogen, and the temperature of said thermal treatment is in the range between 200° C. and 400° C.

2. A method as defined in claim 1 wherein the temperature of said thermal treatment is selected to be about 350° C.

3. A method of preventing voids in aluminum metallization conductor lines on an integrated circuit chip during a manufacturing process which involves subjecting said chip to a high temperature in the range between 300° C. and 400° C. for a period sufficient to allow diffusion of silicon into voids of aluminum metallization conductor lines having micron widths and thicknesses, comprising the step of quenching said chip in a volume of inert liquid at a temperature sufficiently below 25° C. to cool said chip at a rate which prevents precipitation of silicon from said aluminum metallization conductor lines, and said inert liquid is liquid nitrogen.

4. A method of healing voids in aluminum metallization conductor lines on an integrated circuit chip comprising the steps of heating said chip to a temperature in the range of 200°C. to 400° C. for a period sufficiently long for diffusion of silicon into voids of said aluminum metallization conductor lines, and quenching said chip in a volume of inert liquid at a temperature sufficiently below 25° C. to cool said chip at a rate sufficiently high to prevent precipitation of silicon from the aluminum metallization, and said inert liquid is liquid nitrogen, thus healing said voids with an internal equilibrium distribution of Al/Si alloy in said voids.

5. A method as defined in claim 4 wherein said heating temperature is about 350° C.

* * * * *